(12) United States Patent
Smith

(10) Patent No.: US 11,545,189 B2
(45) Date of Patent: Jan. 3, 2023

(54) APPARATUSES AND METHODS FOR DIFFERENT IO WIDTHS FOR STACKED DIE

(71) Applicant: MICRON TECHNOLOGY, INC., Boise, ID (US)

(72) Inventor: Scott Eugene Smith, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/210,922

(22) Filed: Mar. 24, 2021

(65) Prior Publication Data

US 2021/0312954 A1 Oct. 7, 2021

Related U.S. Application Data

(60) Provisional application No. 63/006,206, filed on Apr. 7, 2020.

(51) Int. Cl.
*G11C 5/04* (2006.01)
*G11C 5/06* (2006.01)
(Continued)

(52) U.S. Cl.
CPC .............. *G11C 5/06* (2013.01); *G06F 3/0613* (2013.01); *G06F 3/0659* (2013.01); *G11C 11/4093* (2013.01); *G11C 11/4096* (2013.01)

(58) Field of Classification Search
CPC ............ G11C 11/4093; G11C 11/4096; G11C 2207/105; G11C 2207/108; G11C 5/04; G11C 5/06; G11C 5/063; G11C 7/1006; G11C 7/1018; G06F 11/1004; G06F 11/1048; G06F 11/1076; G06F 13/1668; G06F 3/0613; G06F 3/0659; H01L 2224/0401; H01L 2224/04042; H01L 2224/13025; H01L 2224/16146; H01L 2224/16227; H01L 2224/17181; H01L 2224/48145; H01L 2224/48227; H01L 2224/49111; H01L 2225/06506; H01L 2225/0651; H01L 2225/06513;
(Continued)

(56) References Cited

U.S. PATENT DOCUMENTS 9,953,943 B2 4/2018 Lee et al.
2014/0006700 A1 1/2014 Schaefer et al.
(Continued)

FOREIGN PATENT DOCUMENTS

WO 2019190709 A1 10/2019

OTHER PUBLICATIONS

ISR/WO dated Jul. 19, 2021 for PCT Appl. No. PCT/US2021/024688.
(Continued)

*Primary Examiner* — Thong Q Le
(74) *Attorney, Agent, or Firm* — Dorsey & Whitney LLP

(57) ABSTRACT

Apparatuses and methods for providing data from stacked memory are described. The stacked memory may include multiple die. In some examples, a master die may receive data from one or more slave die. The master die may provide data from the master die and the data from the one or more slave die to a plurality of output terminals. Different ones of the output terminals may provide data from a different die of the stacked memory. In some examples, the data may be retrieved from the multiple die concurrently.

23 Claims, 7 Drawing Sheets

(51) Int. Cl.
*G06F 3/06* (2006.01)
*G11C 11/4096* (2006.01)
*G11C 11/4093* (2006.01)

(58) Field of Classification Search
CPC . H01L 2225/06517; H01L 2225/06527; H01L 2225/06541; H01L 2225/06558; H01L 2225/06562; H01L 2225/06565; H01L 2225/06586; H01L 24/16; H01L 24/17; H01L 24/48; H01L 24/49; H01L 25/0657; H01L 2924/15192; H01L 2924/15311
See application file for complete search history.

(56) References Cited

U.S. PATENT DOCUMENTS

| | | | |
|---|---|---|---|
| 2016/0086642 A1 | 3/2016 | Frans | |
| 2018/0254079 A1* | 9/2018 | Cox | G06F 11/1068 |
| 2019/0278511 A1 | 9/2019 | Lee et al. | |
| 2021/0286739 A1* | 9/2021 | Vankayala | H01L 25/0657 |
| 2021/0311627 A1* | 10/2021 | Smith | G06F 3/0679 |

OTHER PUBLICATIONS

PCT Patent Application PCT/US21/24688 titled "Apparatuses and Methods for Different IO Widths for Stacked Die" filed Mar. 29, 2021.

* cited by examiner

APPARATUSES AND METHODS FOR DIFFERENT IO WIDTHS FOR STACKED DIE

CROSS REFERENCE TO RELATED APPLICATION(S)

This application claims priority to U.S. Provisional Application No. 63/006,206 filed Apr. 7, 2021. The aforementioned application is incorporated herein by reference, in its entirety, for any purpose.

BACKGROUND

In recent years, three-dimensional (3D) memory devices have been introduced. Some 3D memory devices are formed by stacking die vertically and coupling the die using through-silicon (or through-substrate) vias (TSVs) and/or wire bonds. Thus, 3D memory may also be referred to as "stacked memory." 3D memory may provide greater memory capacity and/or higher bandwidth with less increase in area than non-3D memory. Example 3D memory devices include Hybrid Memory Cube (HMC), High Bandwidth Memory (HBM), and Master-Slave Memory (MSM).

MSM may include multiple dynamic random access memory (DRAM) die coupled to one another in a stack. One die may serve as a master die and the remaining die may serve as slave die. The master die may control memory operations of the slave die. In some MSM, the master die and slave die may be identical with either a hardwired or programmable designation as to which die serves as the master die. In other MSM, the master die may have a different design than the slave die. The master die may be the only die of the MSM to directly interface with a component external to the memory (e.g., a substrate, a memory controller). Having only one die directly coupled to a component external to the MSM in a device including the MSM (e.g., a memory module including multiple MSMs, a computing device) may reduce loading on the device. However, this advantage may require that all data from the slave die is transmitted through the master die, which may limit bandwidth and/or speed of the MSM.

DETAILED DESCRIPTION

The apparatuses and methods disclosed herein may allow for 3D memory/stacked memory, such as master slave memory (MSM) to provide wider IO widths without increasing a number of connectors between the die of the stack in some embodiments. A memory device may include multiple die, one of which may be a master die. The master die may include multiple output terminals. The memory device may retrieve data from one or more of the multiple die. Data from the die may be provided to the master die. The master die may provide data from the one or more of the multiple die to different ones of the output terminals.

Figure 1:
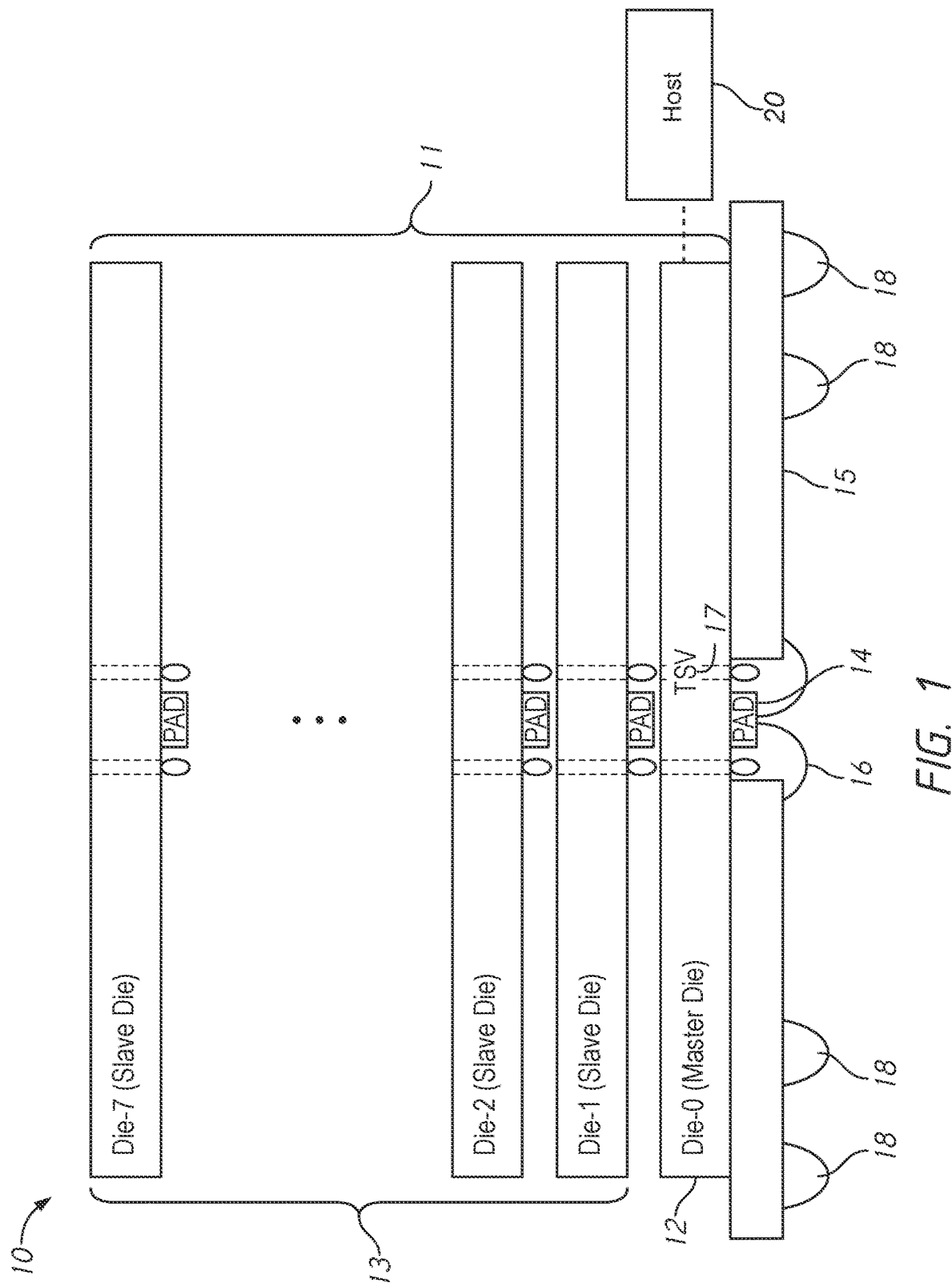
FIG. 1 is a schematic diagram of a memory device including a plurality of dies in accordance with an embodiment of the present disclosure.

FIG. 1 is a schematic diagram of a memory device 10 including multiple die 11 in accordance with an embodiment of the present disclosure. In the embodiment shown in FIG. 1, memory device 10 includes eight die 11, however, memory device 10 may include two or more die. In some embodiments, the die 11 may be arranged in a stack that includes a master die 12 and one or more slave die 13. In some embodiments, the die 11 may be identical to one other with respect to circuit configurations. In some embodiments, master die 12 may be designated as the master die and slave die 13 may be designated as slave die by hardwiring (e.g., fuse blowing) and/or programmed (e.g., writing to a register) on the die 11. The master die (Die-0) 12 may include one or more pads PAD 14 that are coupled to a package substrate 15 via one or more bonding wires 16. The one or more bonding wires 16 may be coupled to lands (e.g., pads) (not shown) of the package substrate 15. Bonding Pads (PAD) of each of the slave die 13 (Die-1 to Die-7) may be in a floating state, decoupled from the package substrate 15. The master die 11 may communicate with each of the slave die 13 (Die-1 to Die-7) by way of vias TSV 17 (e.g., through-substrate or through-silicon vias) and/or wire bonds (not shown). Bump electrodes 18 may be disposed on an outer surface of the package substrate 15. The bump electrodes 18 may be coupled to power lines or signal channels (not shown) of memory device 10 or of a device including memory device 10 (not shown).

The memory device 10 may be a Master-Slave Memory (MSM) in some embodiments. That is, the master die 12 may be the only die of the MSM to directly interface with a component external to the memory (e.g., a substrate, a memory controller). The external component may be included in a host 20 (e.g., computing device, computing system) in some examples. The master die 12 may receive commands, addresses, data, and/or other signals from the host 20 and relay the commands, addresses, data and/or other signals to one or more of the slave die 13 when an operation utilizes one or more of the slave die 13.

Figure 2:
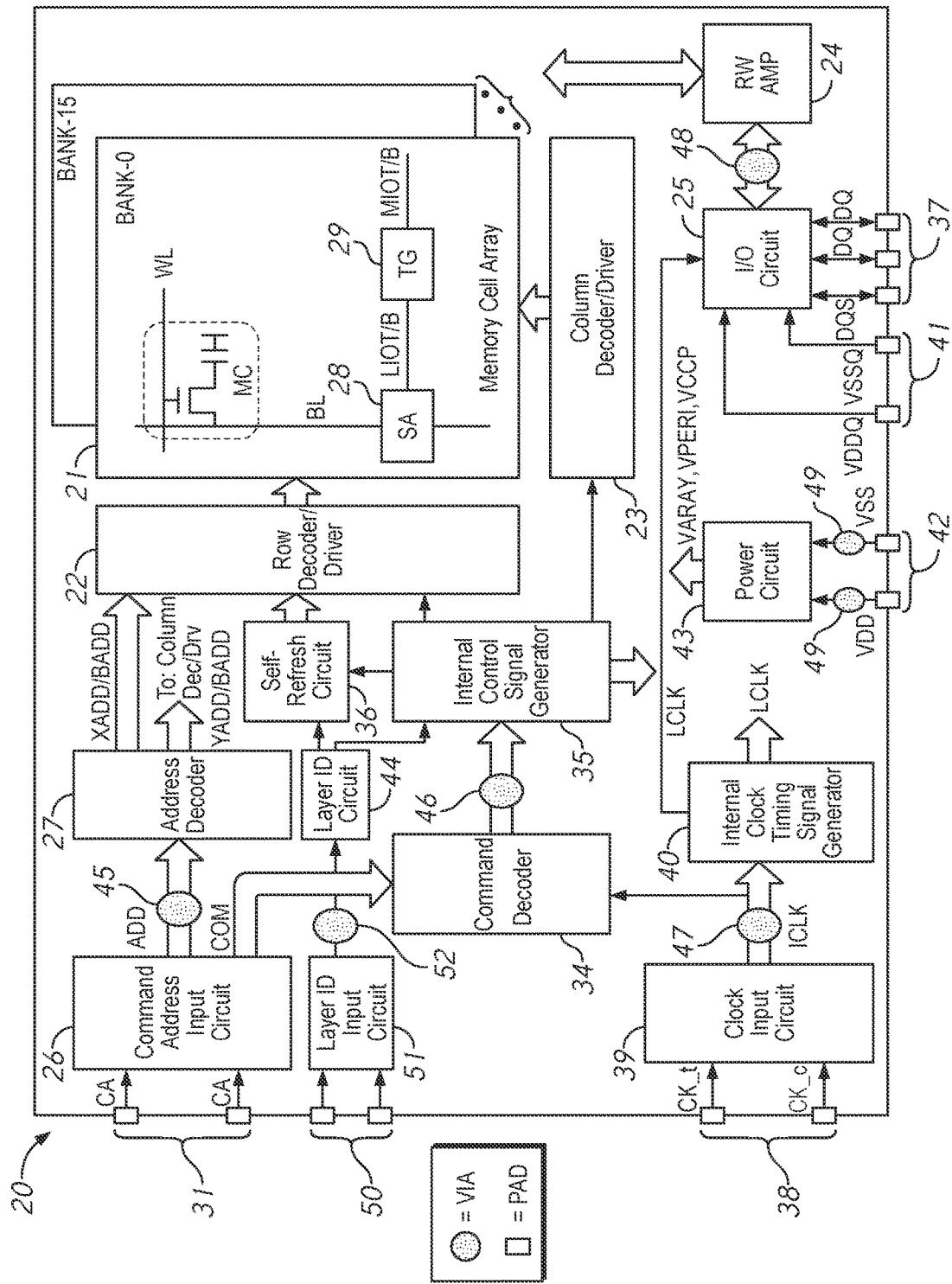
FIG. 2 is a block diagram of a memory die in accordance with an embodiment of the present disclosure.

FIG. 2 is a block diagram of a memory die 20 in accordance with an embodiment of the present disclosure. In some embodiments, the memory die 20 may be used to implement one or more of die 11 shown in FIG. 1. In some embodiments, memory die 20 may be a memory device. For example, the memory die 20 may be a volatile memory device, such as a dynamic random access memory, a static random access memory, or the like. The memory die 20 may be a non-volatile memory device, such as a NOR or NAND flash memory device. The memory die may also be other examples of memory devices, such as, magnetoresistive random access memory, ferroelectric memory, etc. As shown in FIG. 2, the memory die 20 may include a memory cell array 21. The memory cell array 21 includes a plurality of banks (e.g., BANK-0 to BANK-15), each bank including a plurality of memory cells MC arranged at intersections of a plurality of word lines WL and a plurality of bit lines BL. However, for clarity, only a single memory cell MC, word line WL, and bit line BL are shown in FIG. 2. A selection of the word line WL is performed by a row decoder/driver 22 and a selection of the bit line BL is performed by a column decoder/driver 23. Sense amplifiers SA 28 are coupled to corresponding bit lines BL and connected to local I/O line pairs LIOT/B. Local IO line pairs LIOT/B are connected to main IO line pairs MIOT/B via transfer gates TG 29 which are configured as switches.

Turning to the explanation of a plurality of external terminals (or pads) included in the memory die 20, the plurality of external terminals (or pads) may include command/address terminals 31, clock terminals 38, data terminals 37, power supply terminals 41 and 42, and layer ID terminals 50. In some embodiments, the plurality of external terminals may be included in pads 14 in FIG. 1. The command/address terminals 31 may receive command address signals CA and provide the command address signals CA to a command address input circuit 26. The command address input circuit 26 may decode the command address signals CA to generate address signals ADD provided to an address decoder 27 in the master die (e.g., Die-0). The address decoder 27 of each slave die of the slave die (e.g., Die-1 to Die-7) may receive the address signals ADD through address via 45 from the master die (e.g., Die-0). The address decoder 27 may provide decoded row address signals XADD to the row decoder/driver 22, and decoded column address signals YADD to the column decoder/driver 23. The address decoder 27 may also provide bank address signals BADD to the row decoder/driver 22. While the command address terminals 31 and the command address input circuit 26 may be also included in each slave die of the slave die (e.g., Die-1 to Die-7), the address decoder 27 of each slave die of the slave dies (e.g., Die-1 to Die-7) may receive the address signals ADD through address via 45 from the master die (e.g., Die-0). That is, in some embodiments, the command address terminals 31 and/or command address input circuit 26 may be disabled and/or unused on slave die.

In master die (e.g., Die-0), the command address input circuit 26 may provide the command signals COM to a command decoder 34. The command signals COM may include one or more separate signals. The command signals COM received by the command address terminals 31 may be provided to the command decoder 34. The command decoder 34 may decode the command signals COM and provide the decoded command signals to an internal control signal generator 35. The decoded command signals may be provided to an internal control signal generator 35 of each slave die (e.g., Die-1 to Die-7) through command via 46. Thus, in some embodiments, the command decoder 34 of the slave die may be disabled and/or unused. The internal control signal generator 35 may generate various control signals. For example, the control signals may include a row command signal to select a word line and a column command signal, such as a read command or a write command, to select a bit line, and an auto refresh signal that may be provided to a self-refresh circuit 36.

When a row activation command is issued and a row address is timely supplied with the activation command, and a column address is timely supplied with a read command, read data is read from memory cell or cells MC in the memory cell array 21 designated by the row address and column address responsive to a data strobe signal received at a DQS pad of the data terminals 37. The read data DQ is provided as output signals at DQ pads of the data terminals 37 through a read/write amplifier (RW AMP) 24 and an input/output (I/O) circuit 25 and/or through data via 48 between the read/write amplifier 24 and the input/output circuit 25. Similarly, when the row activation command is issued and a row address are timely supplied with the activation command, and a column address is timely supplied with a write command, and then write data DQ is supplied to the DQ pads together with the data strobe signal at the DQS pad of the data terminals 37, the write data DQ is supplied via the input/output circuit 25 and the read/write amplifier 24 to the memory cell array 21 and written in the memory cells MC designated by the row address and the column address.

The data paths between the input/output circuit 25 and the read/write amplifier 24 in a master die (e.g., Die-0) may be coupled through the data via 48 to the data paths between the input/output circuit 25 and the read/write amplifier 24 in each slave die of slave dies (e.g., Die-1 to Die-7). Thus, the input/output circuit 25 of master die (e.g., Die-0) may receive read data from one or more slave die (e.g., Die-1 to Die-7) and write data to be written into one or more slave die (e.g., Die-1 to Die-7). In some embodiments, while the slave die may include I/O circuit 25 and data terminals 37, the I/O circuit 25 and/or one or more of the data terminals 37 may be disabled and/or unused. In some embodiments, the I/O circuit 25 may include switches, logic circuits and/or other control circuitry (not shown) that determines whether data from the master die and/or data from one or more of the slave die is provided to the DQ pads of the data terminals 37. As will be described in more detail, in some embodiments, the I/O circuit 25 of the master die may provide data from the master die and one or more slave die on the DQ pads of the data terminals 37. For example, data terminals 37 may include DQ pads DQ0-7. The I/O circuit 25 may provide data from the master die on DQ pads DQ0-3 and data from a slave die on DQ pads DQ4-7.

The clock terminals 38 may receive external clock signals CK_t and CK_c of the master die (e.g., Die-0), respectively. These external clock signals CK_t and CK_c are complementary to each other and are supplied to a clock input circuit 39. The clock input circuit 39 may receive the external clock signals CK_t and CK_c and may generate an internal clock signal ICLK. The clock input circuit 39 may provide the internal clock signal ICLK an internal clock and timing signal generator 40 and thus a phase controlled internal clock signal LCLK may be generated based on the received internal clock signal ICLK. Although not limited thereto, a DLL circuit can be used as the internal clock and timing signal generator 40. The phase controlled internal clock signal LCLK is supplied to the input/output circuit 25 and may be used as a timing signal for determining an output timing of the read data DQ. The internal clock signal ICLK is also supplied to the command decoder 34 for decoding the command signal COM to generate various control signals. The internal clock signal ICLK from the clock input circuit 39 of the master die (e.g., Die-0) may be supplied through clock via 47 to an internal clock and timing signal generator 40 of the slave die (e.g., Die-1 to Die-7) to perform similar operations to the internal clock and timing signal generator 40 of the master die (e.g., Die-0). In some embodiments, the clock input circuit 39 may not be used and/or disabled on the slave die.

The power supply terminals 41 are supplied with power supply potentials VDDQ and VSSQ. These power supply potentials VDDQ and VSSQ are supplied to the input/output circuit 25. The power supply potentials VDDQ and VSSQ may be the same potentials as the power supply potentials VDD and VSS that are supplied to the power supply terminals 42, respectively. However, the dedicated power supply potentials VDDQ and VSSQ may be used for the input/output circuit 25 so that power supply noise generated by the input/output circuit 25 does not propagate to the other circuit blocks.

The power supply terminals 42 are supplied with power supply potentials VDD and VSS. These power supply potentials VDD and VSS are supplied to a power circuit 43. The internal power circuit 43 may generate various internal potentials VARAY, VPERI, VCCP and the like based on the power supply potentials VDD and VSS. The internal potential VCCP may be a voltage higher than the power supply potential VDD generated by a charge pumping circuit (not shown) and may be mainly used in the row decoder/driver 22. The internal potential VARAY may be mainly used in the sense amplifiers 28 included in the memory cell array 21, and the internal potential VPERI may be used in many other circuit blocks. The power supply potentials VDD and VSS supplied to the power supply terminals 42 of the master die (e.g., Die-0) may be provided to a power circuit 43 of each slave die (e.g., Die-1 to Die-7) through power TSV 49 in order to generate internal potentials for each slave die.

The memory die 20 may include pads and vias. As mentioned earlier, the pads may include the command and address terminals 31, the data terminals 37, the clock terminals 38, and power terminals 41 and 42. For example, the vias may be through silicon vias and the vias may include the address via 45, the command via 46, the clock via 47, the data via 48, the power via 49, and layer via 52. As mentioned earlier, the memory die 20 may be one of the plurality of die 11 in FIG. 1 and the pads of the plurality of die 11 and the vias of the plurality of die 11 may be vertically aligned with one another. The vias of the plurality of die 11 may be coupled to one another. Thus, various signals such command signals, address signals, data signals for receiving and transmitting from and/or to an external apparatus may be shared across the plurality of dies through the vias. In other embodiments, the vias may be replaced by wire bonds. In some embodiments, the die and/or wire bonds may not be vertically aligned (e.g., the wire need not be straight).

In some embodiments, the memory die 20 may include a layer identifier (ID) circuit 44. The layer ID circuit 44 may set layer ID information unique to each memory die 20 in a start-up (e.g., initializing) sequence. The memory die 20 may further include a set of layer ID terminals 50 that may receive layer ID information to designate a memory die to be accessed in access operations. While the layer ID information at the terminals 50 is supplied to the input circuit 51, the input circuit 51 may provide the layer ID information to the layer ID circuit 44 of the master die (e.g., Die-0) and may simultaneously provide the layer ID information to the layer ID circuit 44 of each slave die of the slave dies (e.g., Die-1 to Die-7) through the layer via 52. The layer ID circuit 44 may activate the memory die 20 in response to the layer ID information and the command signals received at the command address terminals 31, if the layer ID information is indicative of the memory die 20. In some embodiments, the layer ID information may indicate which die in a stack of die is the master die and which die are slave die. However, in some embodiments, the master/slave assignments and/or layer ID information may be hardcoded (e.g., wired, fuse blowing) in the memory die 20, for example, within the layer ID circuit 44. The layer ID circuit 44 may also activate the internal control signal generator 35 and/or other circuits in some embodiments. In some examples, some or all of the layer ID information may be self-generating and/or may be by fuse selection. When the layer ID information is self-generating, the memory die 20 may communicate with other die and to determine the memory die's 20 position in the stack based on the interconnects between the other die. In some examples, memory die 20 may include a circuit that can detect memory die 20's position based, at least in part, on how the TSVs and/or wirebonds connect to each die. Thus, when a command is given, a set of inputs may be applied to a master die, which may then pass the inputs to each die and the layer ID information may allow each die, including memory die 20, to decode those inputs to select the appropriate memory die in the stack to execute the command.

Figure 3:
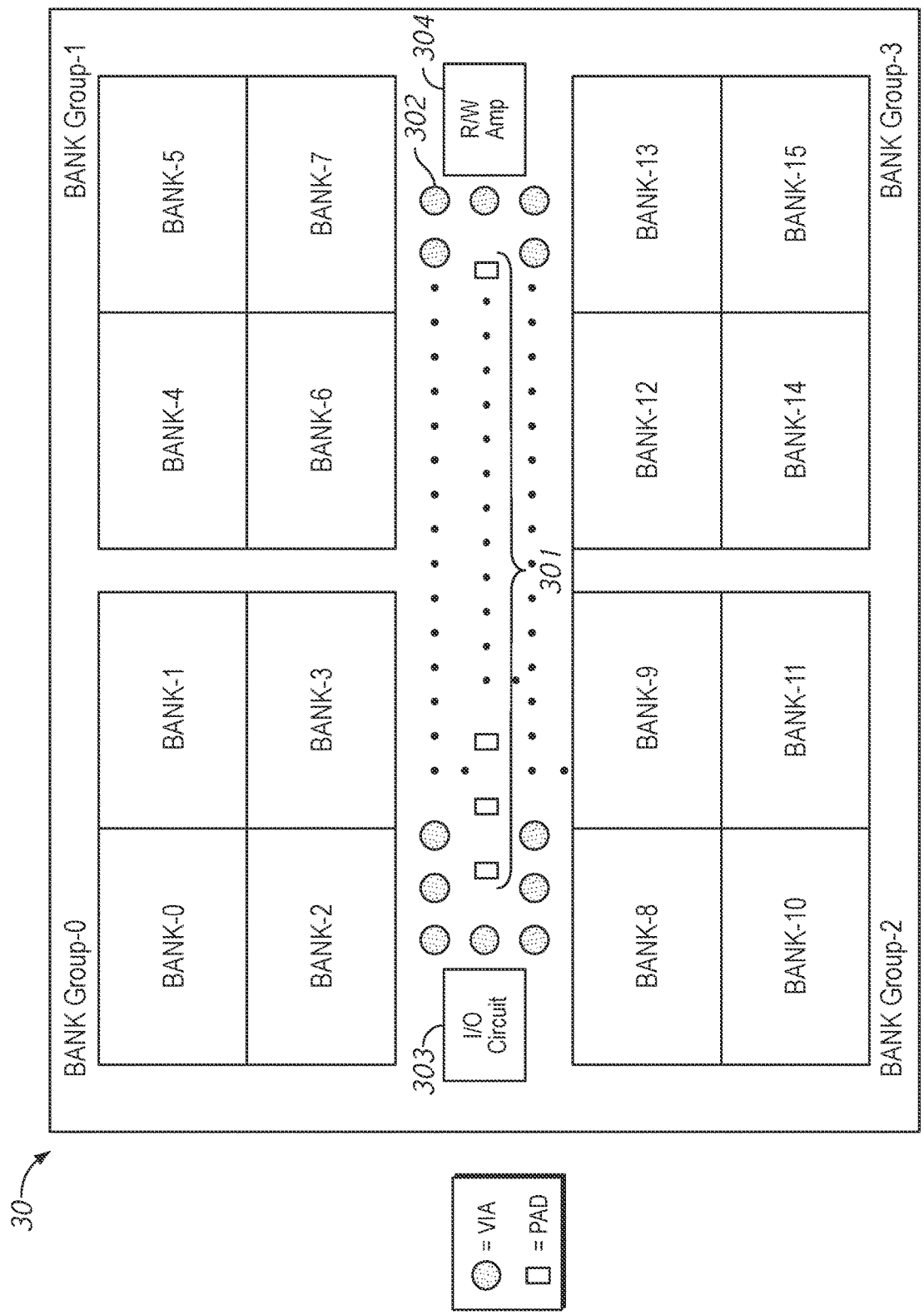
FIG. 3 is a layout diagram of a memory die in accordance with an embodiment of the present disclosure.

FIG. 3 is a layout diagram of a memory die 30 in accordance with an embodiment of the present disclosure. In some embodiments, memory die 30 may be included in memory die 20 of FIG. 2 and/or one or more memory die 11 of FIG. 1. The memory die 30 may include one or more memory banks divided into groups. For example, the number of memory banks may be sixteen (e.g., BANK-0 to BANK-15) and the memory banks may be divided into four bank groups (e.g., BANK Group-0 to BANK Group-3). Thus, each bank group may include one or more banks (e.g., four banks).

The memory die 30 may also include peripheral areas including a central area and edge areas. The peripheral areas may include various elements shown in FIG. 2. For example, one or more pads (PADs) 301 may be included in a central peripheral area of the memory die 30. One or more vias (e.g., TSVs) 302 may also be included in the central peripheral area and disposed around or in the vicinity of the pads 301. In some embodiments, some or all of the vias 302 may be replaced by wire bonds. The vias 302 may be used for communication between different die of a stack such as between master die 12 and slave die 13 of FIG. 1. For example, the vias 302 may be used to transmit commands and/or data between die. Various circuits may be disposed in the peripheral area of the memory die 30. For example, input/output circuits 303 and read/write amplifiers 304 may be disposed in the central peripheral area. The input/output circuit 304 and the read/write amplifiers 304 may operate as previously described with reference to FIG. 2. The arrangement of components in FIG. 3 is provided only as an example and the layout of the banks and peripheral areas of memory die 30 may be different in other embodiments. Although only the pads 301 and bias 302, and input/output circuits 303 and read/write amplifiers 304 are shown, as noted previously, the peripheral areas may include some or all of the elements shown in FIG. 2. This may leave limited space for vias and/or wire bonds.

Figure 4:
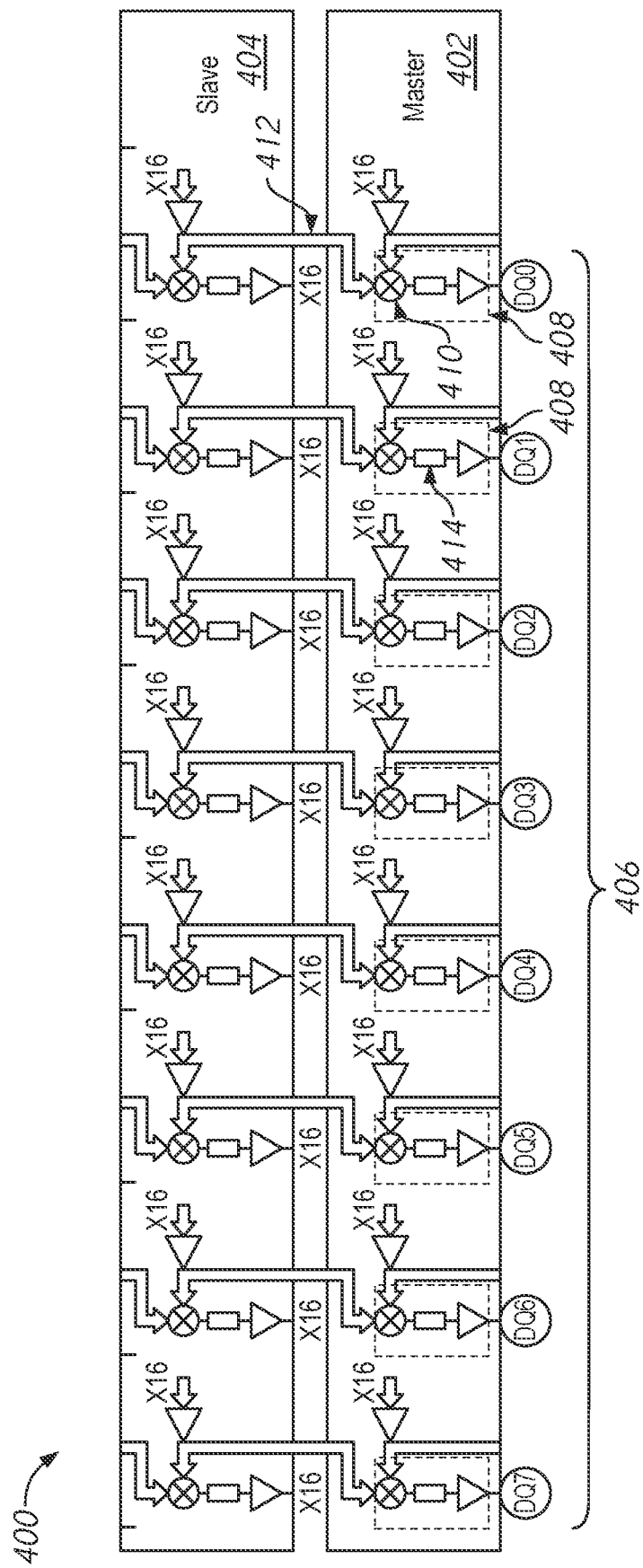
FIG. 4 is a schematic diagram of a memory device in accordance with an embodiment of the present disclosure.

FIG. 4 is a schematic diagram of a memory device 400 in accordance with an embodiment of the present disclosure. The memory device 400 includes a master die 402 and a slave die 404. In some embodiments, the memory device 400 may be an ×8 device with a burst length of 16. That is, the IO width is eight bits (e.g., number of DQ pads 406 is eight) and each of the DQ pads 406 outputs 16 bits in series during a burst of data (e.g., a data burst), for example during a read operation. The master die 402 and slave die 404 may be coupled together (e.g., wired) such that the data provided to the DQ pads 406 come from the master die 402 or the slave die 404. As discussed with reference to FIG. 2, an IO circuit 408 of the master die 402 may receive data from the master die 402 and/or slave die 404 and data selection circuits 410 of the I/O circuit 408 may be used to determine which data to provide to the DQ pads 406.

Although only eight connectors 412 are shown between the master die 402 and slave die 404, in actuality, there are many more connectors (e.g., wire bonds, vias) between the master die 402 and slave die 404 to transmit data. Continuing the above example, for an ×8 IO width and a 16BL, 128 bits of data must be transmitted to the DQ pads 406. Typically, all 128 bits are provided to the IO circuit 408 in parallel, which then serializes the bits with a serializer circuit 414 for output to the DQ pads 406. In some embodiments, the serializer circuit 414 may include a first-in-first-out (FIFO) circuit. Providing all of the bits in parallel from the slave die 404 to the master die 402 requires 128 vias and/or wire bonds. As discussed with reference to FIG. 3, there is limited space on the memory die for providing vias and/or wire bonds. In some applications, the memory die may not be capable of supporting 128 connectors. Thus, a memory device that can support wider IO widths (e.g., ×8, ×16) without increasing (or without significantly increasing) the number of connectors between master and slave die is desired. Some or all of the data could be provided serially to reduce the number of vias and/or wire bonds required for the embodiment of an ×8 device shown in FIG. 4. However, the power requirements for providing serial data is typically too high to be supported by memory device 400. Furthermore, providing serial data may place a burden on the vias and/or wire bonds, which may lead to errors in data transmission and/or hardware failure.

In some embodiments of the present disclosure, a memory device may include multiple die, one of which may be a master die. The master die may include multiple output terminals (e.g., DQ pads). The memory device may provide data (e.g., responsive to a read command) from the multiple die concurrently (e.g., simultaneously or near simultaneously). For example, data from one or more of the multiple die may be provided to the master die, and a portion of the output terminals will output data from the master die and another portion of the output terminals will output data from the one or more of the multiple die. By using the multiple die to provide different portions of the output, in some embodiments, the IO width of the memory device may be increased. In some embodiments, the IO width may be increased without increasing a number of connectors between the die or decreasing a number of additional connectors required.

Figure 5:
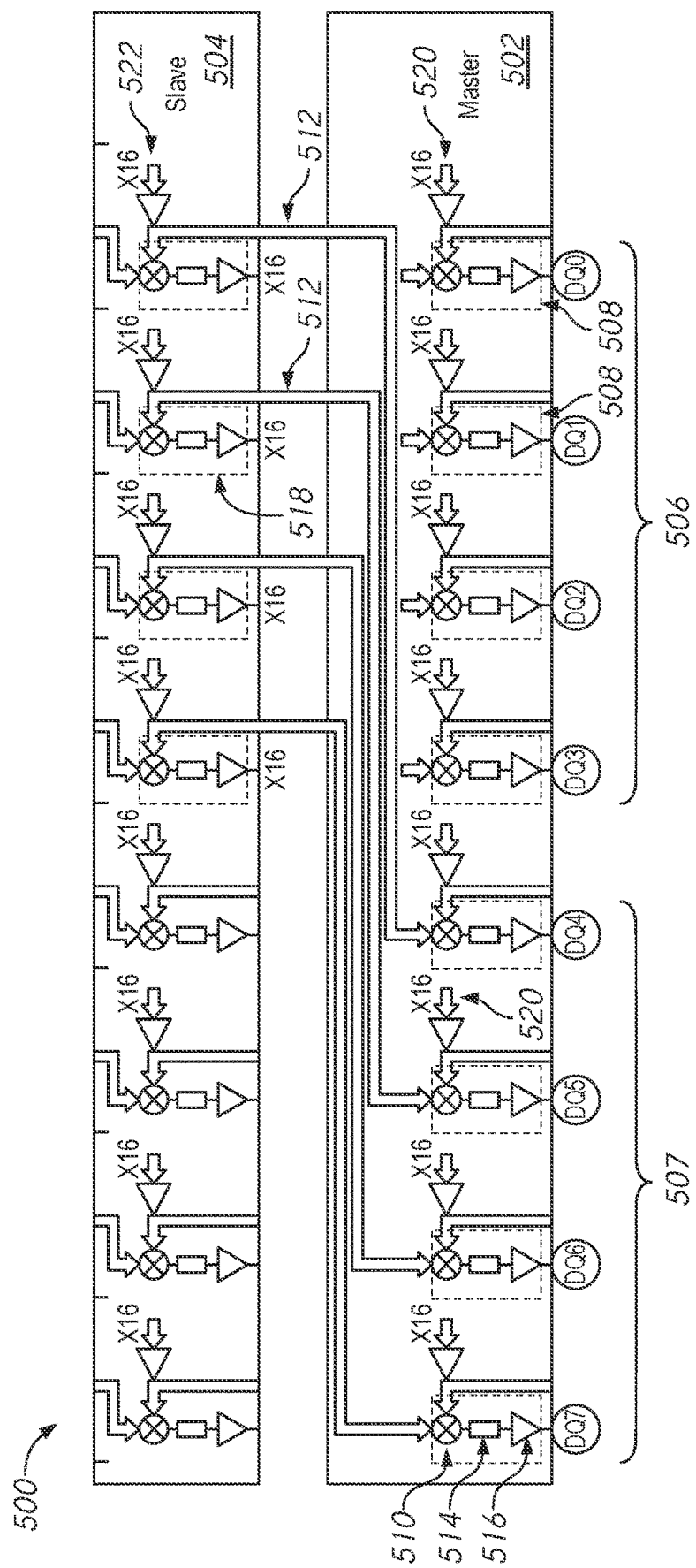
FIG. 5 is a schematic diagram of a memory device in accordance with an embodiment of the present disclosure.

FIG. 5 is a schematic diagram of a memory device 500 in accordance with an embodiment of the present disclosure. In some embodiments, memory device 500 may be included in memory device 10 of FIG. 1. In some embodiments, memory device 500 may include memory die 20 of FIG. 2 and/or memory die 30 of FIG. 3. In some embodiments, memory device 500 may be an ×8 device with a burst length of 16.

Memory device 500 may include a master die 502 and a slave die 504. Master die 502 and slave die 504 may have similar or identical circuit layouts in some embodiments. For example, master die 502 and slave die 504 may both include all of the components shown in memory die 20 shown in FIG. 2. In some embodiments, one or more components on the slave die 504 may be disabled and/or unused. For example, the command decoder may be disabled and/or unused on the slave die 504. Master die 502 and slave die 504 may be coupled by one or more connectors 512. In some embodiments, the connectors 512 may include TSVs and/or wire bonds. Other suitable connectors may be used in other embodiments. As will be described, at least some of the connectors 512 may be used to transmit and/or receive data between the master die 502 and slave die 504.

The master die 502 may include multiple output terminals. In the embodiment shown in FIG. 5, the master die includes eight output terminals, with the output terminals divided into two groups of four: output terminals 506 (DQ0-3) and output terminals 507 (DQ4-7). One or more of the output terminals from output terminals 506 and/or 507 may be coupled to a component external to memory device 500 (e.g., a substrate, a memory controller). The output terminals 506 and 507 (DQ0-7) may receive data from a respective IO circuit 508 of the master die 502. The IO circuit 508 may be included in IO circuit 25 in some embodiments. The IO circuit 508 may include a data selection circuit 510, a serializer circuit 514, and an output buffer 516 in some embodiments. In some embodiments, such as the one shown in FIG. 5, the IO circuit 508 may include a data selection circuit 510, a serializer circuit 514, and an output buffer 516 for each of the output terminals 506 and 507.

The data selection circuit 510 may receive data from a memory cell array (not shown in FIG. 5), such as memory cell array 21, of the master die 502 via data path 520. Data path 520 may include a conductive line between a read/write amplifier (not shown in FIG. 5), such as read/write amplifier 24, and the IO circuit 25 in some embodiments. The data selection circuit 510 may receive data from a memory cell array (not shown in FIG. 5) of slave die 504 via connectors 512. In some embodiments, such as the one shown in FIG. 5, data from the data path 522 may be provided to the connectors 512. In some embodiments, the data path 522 may include a conductive line between a read/write amplifier (not shown in FIG. 5) of the slave die 504 and the connectors 512. In other embodiments, the data path 522 may provide data from the memory cell array to an IO circuit 518 of the slave die 504 and the IO circuit 518 may provide the data to the connectors 512. When the IO circuit 518 provides the data (e.g., instead of from the read/write amplifier of the slave die), the data may optionally be provided serially from the slave die 504 to the master die 502 in some examples. However, utilizing the IO circuit 518 of the slave die 504 may use more power.

The data selection circuit 510 may include control logic and/or other circuitry to select whether to output data received from the master die 502 or the slave die 504. For example, the data selection circuit 510 may include a multiplexer and/or one or more OR logic gates to select between the data from the master die 502 and the slave die 504. The data selection circuit 510 may provide data from the master die 502 to one group of output terminals 506 and provide data from the slave die 504 to the other group of output terminals 507. In the example shown in FIG. 5, DQ0-3 output data from the master die 502 and DQ4-7 output data from the slave die 504. In some embodiments, the data selection circuits 510 may be hardwired to always provide data from the master die 502 or slave die 504.

Data may be provided from the memory arrays of the master die 502 and slave die 504 as parallel data. For example, data paths 520 and 522 may include conductive lines for each bit of data to be transmitted. Furthermore, to transmit data from the slave die 504 to the master die 502, the number of connectors 512 may equal the number of conductive lines in data path 522. The parallel data may be provided to a serializer circuit 514. In some embodiments, the serializer circuit may include a FIFO circuit. The serializer circuit 514 may receive the parallel data and serialize it prior to providing it to the output terminals 506 and 507. In some embodiments, the serialized data may be provided to an output buffer 516 prior to being provided to the output terminals 506 and 507.

In addition to providing parallel data from the memory arrays, in some embodiments, the data from the master die 502 and slave die 504 may be accessed/retrieved concurrently. As a result, the data retrieved from both die may be provided to the IO circuit 508 simultaneously and/or near simultaneously in some embodiments. The data retrieved from the master die 502 and the slave die 504 may be provided to the output terminals simultaneously or near simultaneously to support an ×8 IO width for the memory device 500.

In contrast to the embodiment shown in FIG. 4, to support a ×8 memory device with a 16 bit burst length, memory device 500 may only have 64 connectors 512. Instead of choosing to provide data for the output terminals from either the master die 502 or the slave die 504 as in memory device 400, in some embodiments, memory device 500 may provide a portion of the data from the master die 502 and another portion of the data from the slave die 504. Providing different portions of the data from different die of the memory device 500 may reduce a number of connectors 512 required to support an ×8 IO width in some embodiments.

The principles of the present disclosure are not limited to a particular number of die (e.g., two die as shown in FIG. 5) or a particular IO width (e.g., ×8 as shown in FIG. 5). Rather, apparatuses and methods disclosed herein may be applied to any number of die and IO width.

Figure 6:
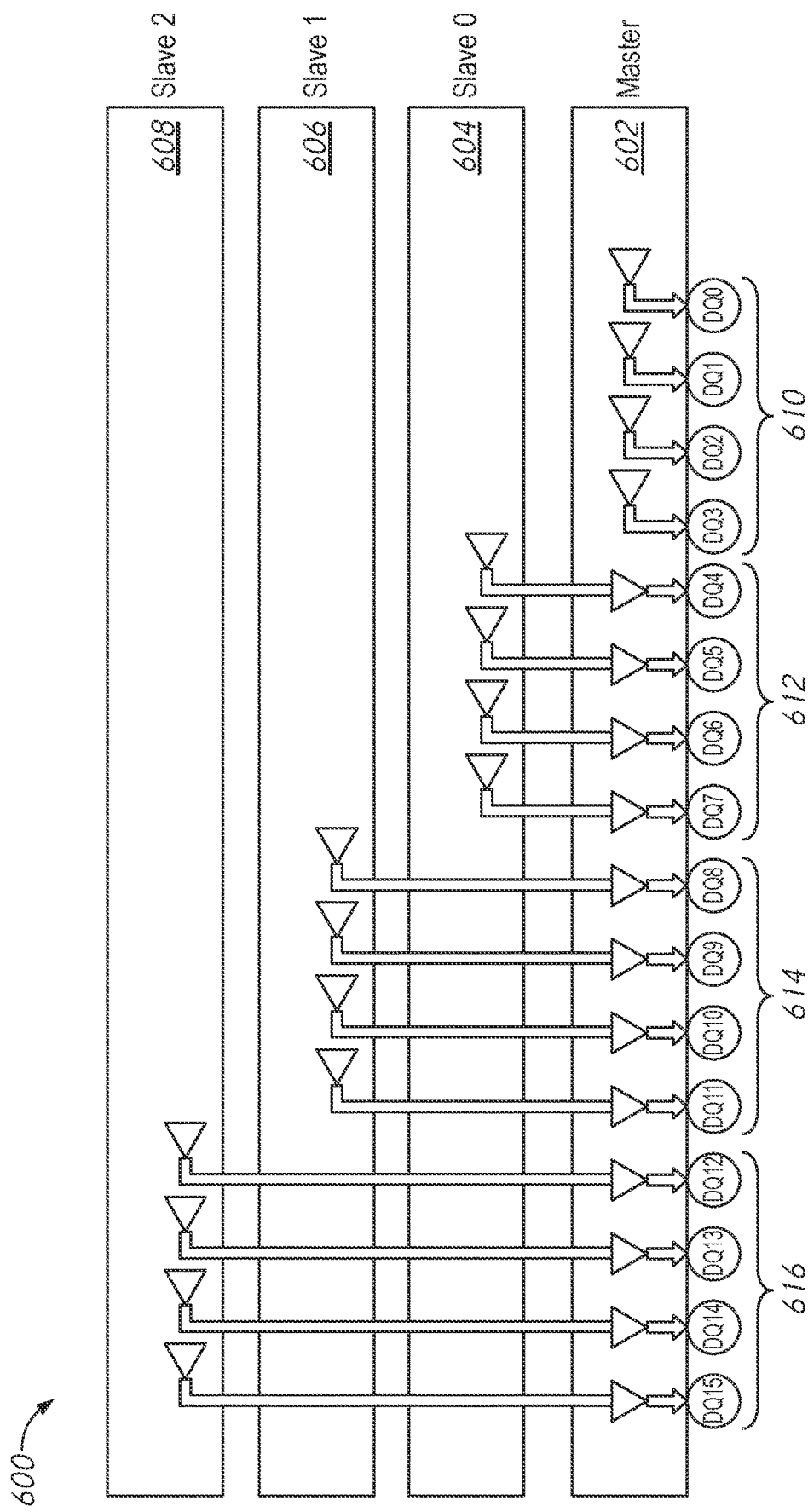
FIG. 6 is a schematic diagram of a memory device in accordance with an embodiment of the present disclosure.

FIG. 6 is a schematic diagram of a memory device 600 in accordance with an embodiment of the present disclosure. In some embodiments, memory device 600 may be included in memory device 10 of FIG. 1. In some embodiments, memory device 600 may include memory die 20 of FIG. 2 and/or memory die 30 of FIG. 3. In some embodiments, memory device 600 may be a ×16 device. Memory device 600 may include master die 602 and slave die 604, 606, and 608. The master die 602 and slave die 604, 606, and 608 may include one or more components substantially the same as master die 502 and slave die 504, respectively, for example, IO circuits, data paths, and connectors. For brevity, an explanation of these components will not be repeated here.

In some embodiments, a ×16 IO width may be supported by memory device 600 by providing a portion of the data from each die 602-608 to different portions of the output terminals 610-616 of the master die 602. In the example shown in FIG. 6, data from the master die 602 is provided to output terminals 610; data from slave die 604 is provided to output terminals 612; data from slave die 606 is provided to data terminals 614; and data from slave die 608 is provided to output terminals 616.

Similar to memory device 500, data may be provided from the memory arrays of the master die 602 and slave die 604, 606, and 608 as parallel data which may then be serialized on the master die 602. In some embodiments, the data from the master die 602 and slave die 604, 606, and 608 may be accessed/retrieved concurrently. As a result, the data retrieved from all die may be provided the output terminals 610-616 simultaneously or near simultaneously to support an ×16 IO width for the memory device 600. In some embodiments, memory device 600 may require fewer connectors between the die 602-608 to support a ×16 IO width than a memory device that provides all of the data from a single die.

Figure 7:
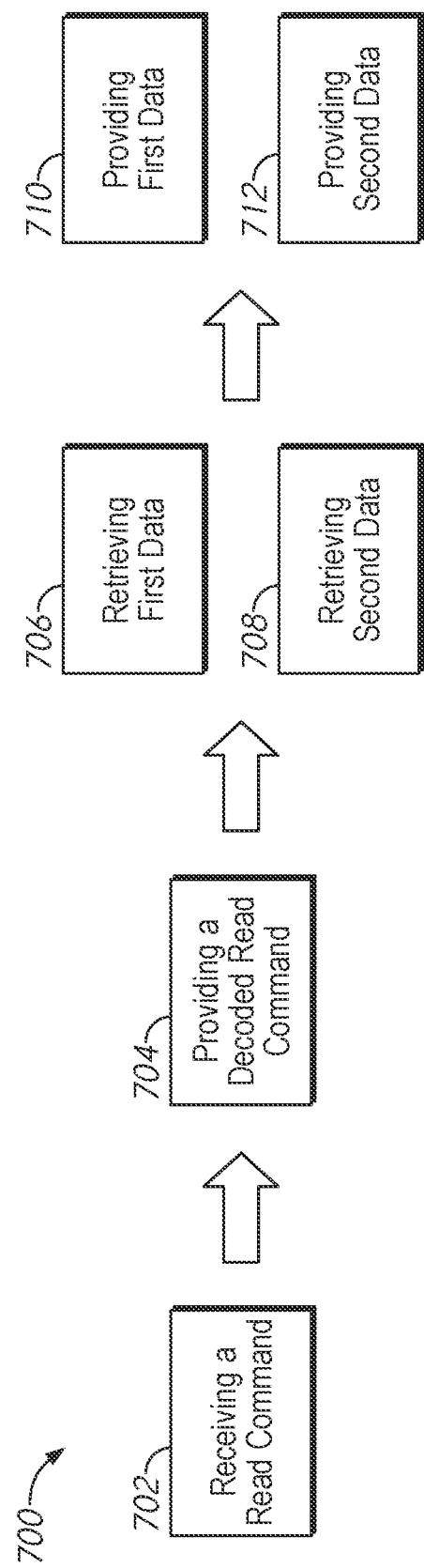
FIG. 7 is a flow chart of a method in accordance with an embodiment of the present disclosure.

FIG. 7 is a flow chart of a method 700 in accordance with an embodiment of the present disclosure. In some embodiments, some or all of the method 700 may be performed by memory device 10, memory die 20, memory die 30, memory device 500, and/or memory device 600.

At block 702, "receiving a read command" may be performed. In some embodiments, the read command may be received at a command decoder, such as command decoder 34. At block 704, "providing a decoded read command" may be performed. The decoded read command may be provided by the command decoder in some embodiments. In some embodiments, the decoded read command may be provided to a first die and a second die. In some embodiments, the first die may be a master die, such as master die 12, 502, and/or 602. In some embodiments, the second die may be a slave die, such as slave die 13, 504, and/or 604-608. In some embodiments, the command decoder is located on the first die.

At block 706, "retrieving first data" may be performed. In some embodiments, the retrieving is performed responsive to responsive to the decoded read command. In some embodiments, the first data may be retrieved from a memory cell array, such as memory cell array 21, of the first die. At block 708, "retrieving second data" may be performed. In some embodiments, the retrieving is performed responsive to responsive to the decoded read command. In some embodiments, the second data may be retrieved from a memory cell array, such as memory cell array 21, of the second die. In some embodiments, blocks 706 and 708 may be performed concurrently (e.g., at the same time, simultaneously or near simultaneously).

At block 710, "providing the first data" may be performed. The first data may be provided on a first plurality of output terminals in some embodiments, such as output terminals 37, 506, and/or 610. At block 712, "providing the second data" may be performed. The second data may be provided on a second plurality of output terminals in some embodiments, such as output terminals 37, 507, and/or 612-616. In some embodiments, blocks 710 and 712 may be performed concurrently (e.g., at the same time, simultaneously or near simultaneously). In some embodiments, all of the output terminals are located on the first die. In some embodiments, the second data is provided to the output terminals by TSVs. In other embodiments, the second data is provided to the output terminals by wire bonds. In some embodiments, the first and second data may be provided as parallel data. The first and second data may be serialized (e.g., by serializer circuit 514) prior to being provided to the output terminals.

The apparatuses and methods disclosed herein may allow for 3D memory/stacked memory, such as master slave memory (MSM) to provide wider IO widths without increasing a number of connectors between the die of the stack in some embodiments. A memory device may include multiple die, one of which may be a master die. The master die may include multiple output terminals. The memory device may retrieve data from one or more of the multiple die. Data from the die may be provided to the master die. The master die may provide data from the one or more of the multiple die to different ones of the output terminals.

The description of certain embodiments herein is merely exemplary in nature and is in no way intended to limit the scope of the disclosure or its applications or uses. In the detailed description of the present apparatuses, systems and methods, reference is made to the accompanying drawings which form a part hereof, and which are shown by way of illustration specific embodiments in which the described apparatuses, systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features are not discussed when they would be apparent to those with skill in the art so as not to obscure the description of embodiments of the disclosure. The detailed description is therefore not to be taken in a limiting sense, and the scope of the disclosure is defined only by the appended claims.

Of course, it is to be appreciated that any one of the examples, embodiments or processes described herein may be combined with one or more other examples, embodiments and/or processes or be separated and/or performed amongst separate devices or device portions in accordance with the present systems, devices and methods. Finally, the above-discussion is intended to be merely illustrative and should not be construed as limiting the appended claims to any particular embodiment or group of embodiments. Thus, while various embodiments of the disclosure have been described in particular detail, it should also be appreciated that numerous modifications and alternative embodiments may be devised by those having ordinary skill in the art without departing from the broader and intended spirit and scope of the present disclosure as set forth in the claims that follow. Accordingly, the specification and drawings are to be regarded in an illustrative manner and are not intended to limit the scope of the appended claims.

What is claimed is:

1. An apparatus comprising:
   a first memory die;
   a second memory die;
   a plurality of connectors adjacent to or within the first memory die and coupled to the second memory die;
   a first plurality of output terminals coupled to the first memory die and configured to output a first set of bits of a data burst received from the first memory die; and
   a second plurality of output terminals coupled to the first memory die and configured to output a second set of bits of the data burst received from the second memory die via the plurality of connectors.

2. The apparatus of claim 1, wherein the first memory die comprises an IO circuit coupled to the plurality of connectors, the first plurality of output terminals, and the second plurality of output terminals, wherein the IO circuit is configured to provide the first set of bits to the first plurality of output terminals and the second set of bits to the second plurality of output terminals.

3. The apparatus of claim 1, wherein the plurality of connectors comprise wire bonds.

4. The apparatus of claim 1, wherein the second set of bits from the second memory die is provided in parallel to the plurality of connectors.

5. The apparatus of claim 1, wherein the second set of bits from the second memory die is provided serially to the plurality of connectors.

6. The apparatus of claim 1, wherein the first memory die is configured to receive command and address signals from a host and to relay the command and address signals to the second memory die.

7. A memory device comprising:
   a first die comprising a first plurality of output terminals configured to provide a first plurality of bits of a data burst and a second plurality of output terminals configured to provide a second plurality of bits of the data burst; and
   a second die configured to provide the second plurality of bits to the first die.

8. The memory device of claim 7, the second plurality of bits are provided from the second die as parallel data.

9. The memory device of claim 7, further comprising a plurality of connectors coupled to the first die and the second die configured to provide the second plurality of bits from the second die to the first die.

10. The memory device of claim 7, further comprising:
    a third die; and
    a fourth die;
    wherein the first die further comprises a third plurality of output terminals and a fourth plurality of output terminals;
    wherein the third die is configured to provide a third plurality of bits of the data burst to the third plurality of output terminals and the fourth die is configured to provide a fourth plurality of bits of the data burst to the fourth plurality of output terminals.

11. The memory device of claim 10, wherein the second data, the third data, and the fourth data are received concurrently by the first die.

12. The memory device of claim 7, wherein the first die is configured to receive commands from an external component and provide at least some of the commands to the second die.

13. The memory device of claim 12, wherein the second plurality of bits is provided from the second die responsive to receiving a command from the first die.

14. The memory device of claim 12, wherein the external component comprises a memory controller.

15. The memory device of claim 7, wherein a circuit layout of the first die is identical to a circuit layout of the second die.

16. The memory device of claim 7, wherein the output terminals are configured to be coupled to a component external to the memory device.

17. A method comprising:
    receiving a read command at a first die;
    providing, the read command from the first die to a second die;
    responsive to the read command:
       providing first data on a first plurality of output terminals of the first die; and
       providing second data from the second die on a second plurality of output terminals of the first die.

18. The method of claim 17, wherein the first data and the second data are retrieved from the first die and the second die at a same time.

19. The method of claim 17, wherein providing the first data and providing the second data are performed at a same time.

20. The method of claim 17, wherein the first data and the second data are data of a data burst.

21. The method of claim 17, wherein the second data is provided from the second die to the second plurality of output terminals, at least in part, by through-silicon vias.

22. The method of claim 17, wherein the read command is received from a host.

23. The method of claim 17, wherein the second data is provided as serialized data.

* * * * *